(12) United States Patent
Su

(10) Patent No.: US 10,757,802 B2
(45) Date of Patent: Aug. 25, 2020

(54) DIFFERENTIAL TRANSMISSION LINE FORMED ON A WIRING SUBSTRATE AND HAVING A METAL CONDUCTOR GROUND LAYER, WHERE A METAL CONDUCTOR REMOVAL BLOCK IS FORMED IN THE GROUND LAYER AT A LOCATION OF CURVED SECTIONS OF THE DIFFERENTIAL TRANSMISSION LINE

(71) Applicant: Wistron Corporation, New Taipei (TW)

(72) Inventor: Po-Lung Su, New Taipei (TW)

(73) Assignee: Wistron Corporation, New Taipei (TW)

(*) Notice: Subject to any disclaimer, the term of this patent is extended or adjusted under 35 U.S.C. 154(b) by 0 days.

(21) Appl. No.: 16/131,046

(22) Filed: Sep. 14, 2018

(65) Prior Publication Data

US 2019/0341664 A1 Nov. 7, 2019

(30) Foreign Application Priority Data

May 3, 2018 (TW) .............................. 107114984 A

(51) Int. Cl.
*H05K 1/02* (2006.01)
*H01P 3/08* (2006.01)
*H01P 1/02* (2006.01)

(52) U.S. Cl.
CPC ............. *H05K 1/0245* (2013.01); *H01P 1/02* (2013.01); *H01P 3/08* (2013.01); *H05K 1/0225* (2013.01);
(Continued)

(58) Field of Classification Search
CPC ......... H01P 3/026; H01P 3/04; H05K 1/0245; H05K 1/0225
(Continued)

(56) References Cited

U.S. PATENT DOCUMENTS 6,590,466 B2 * 7/2003 Lin et al. ............. H05K 1/0224
333/1
7,495,523 B2 2/2009 Kanno et al.
(Continued)

FOREIGN PATENT DOCUMENTS

| TW | 200806139 | 1/2008 |
|----|-----------|--------|
| TW | 201010171 | 3/2010 |
| WO | 2010103721 | 9/2010 |

OTHER PUBLICATIONS

"Office Action of Taiwan Counterpart Application," dated Jul. 26, 2019, p. 1-p. 6.
(Continued)

*Primary Examiner* — Benny T Lee
(74) *Attorney, Agent, or Firm* — JCIPRNET

(57) ABSTRACT

A differential transmission line and a wiring substrate are provided. The differential transmission line includes a ground layer, a dielectric layer, a first transmission line, and a second transmission line. The ground layer is formed of a metal conductor. The dielectric layer is disposed on the ground layer. The first transmission line and the second transmission line are disposed on the dielectric layer. A metal conductor removal block is distributed in at least a portion of at least one of a first projection area of the ground layer on which to project the first transmission line and a second projection area of the ground layer on which to project the second transmission line. A metal conductor is provided in a region between the first projection area and the second projection area of the ground layer.

22 Claims, 9 Drawing Sheets

(52) U.S. Cl.
CPC . *H05K 1/0253* (2013.01); *H05K 2201/09272* (2013.01)

(58) Field of Classification Search
USPC .......................................................... 333/4, 5
See application file for complete search history.

(56) References Cited

U.S. PATENT DOCUMENTS

| | | |
|---|---|---|
| 8,040,200 B2 | 10/2011 | Minegishi et al. |
| 9,549,460 B2 * | 1/2017 | Watanabe et al. ... H05K 1/0216 |
| 2007/0164401 A1 | 7/2007 | Higuchi |
| 2009/0315649 A1 | 12/2009 | Minegishi et al. |
| 2012/0229998 A1 | 9/2012 | Kagaya |

OTHER PUBLICATIONS

F. Gisin, et al., "Routing Differential I/O Signals Across Split Ground Planes at the Connector for EMI Control," IEEE International Symposium on Electromagnetic Compatibility, Aug. 2000, pp. 325-327.

A. Weisshaar, et al., "Modeling of Radial Microstrip Bends," IEEE International Digest on Microwave Symposium, May 1990, pp. 1051-1054.

M. Kirschning, et al., "Measurement and Computer-Aided Modeling of Microstrip Discontinuities by an Improved Resonator Method," IEEE MTT-S International Microwave Symposium Digest, May 31-Jun. 3, 1983, pp. 495-497.

"Office Action of China Counterpart Application", dated Apr. 17, 2020, p. 1-p. 9.

* cited by examiner

DIFFERENTIAL TRANSMISSION LINE FORMED ON A WIRING SUBSTRATE AND HAVING A METAL CONDUCTOR GROUND LAYER, WHERE A METAL CONDUCTOR REMOVAL BLOCK IS FORMED IN THE GROUND LAYER AT A LOCATION OF CURVED SECTIONS OF THE DIFFERENTIAL TRANSMISSION LINE

CROSS-REFERENCE TO RELATED APPLICATION

This application claims the priority benefit of Taiwan application serial no. 107114984, filed on May 3, 2018. The entirety of the above-mentioned patent application is hereby incorporated by reference herein and made a part of this specification.

BACKGROUND OF THE DISCLOSURE

1. Field of the Disclosure

The disclosure relates to a transmission line, and more particularly relates to a differential transmission line and a wiring substrate.

2. Description of Related Art

In the field of radio frequency (RF), how to design a differential transmission line capable of providing an effect of high-speed signal transmission has always been one of the important technical issues. In particular, the problem of common mode noises occurring in a curved section of the differential transmission line usually places a severe influence on the completeness of a differential signal and electromagnetic radiation, thereby leading to a serious problem of distortion in a process of transmitting the differential signal by the differential transmission line. For example, the prior art reference of U.S. Pat. No. 7,495,523 states a technical means of removing a metal conductor from a ground layer of a differential transmission line. The prior art reference describes that a portion of the metal conductor (in the shape of a slot) is removed from the ground layer of the differential transmission line in a direction perpendicular to the differential transmission line. In this case, when a common mode signal passes a portion of the differential transmission line that corresponds to the removed metal conductor, the common mode signal may be proportionately reflected to reduce the common mode signals transmitted in the differential transmission line reaching a receiver, thereby reducing the common mode noises. However, for the prior art reference, the common mode noises are not directly reduced, so the problem of signal interference remains unsolved. In light of this, approaches according to several types of exemplary embodiments are presented below.

SUMMARY OF THE DISCLOSURE

The disclosure provides a differential transmission line and a wiring substrate that is capable of reducing a common mode noise source of the differential transmission line effectively and reducing the proportion (Scd21) of common mode noises caused in a process of transmitting differential signals transmitted via a curved section of the differential transmission line.

The differential transmission line according to the disclosure includes a ground layer, a dielectric layer, a first transmission line, and a second transmission line. The ground layer is formed of a metal conductor. The dielectric layer is disposed on the ground layer. The first transmission line and the second transmission line are disposed on the dielectric layer. A metal conductor removal block is distributed in at least one portion of at least one of a first projection area of the ground layer on which to project a curved section of the first transmission line and a second projection area of the ground layer on which to project a curved section of the second transmission line. A metal conductor is provided in a region between the first projection area and the second projection area of the ground layer.

The wiring substrate according to the disclosure includes at least one differential transmission line structure. The differential transmission line structure includes a ground layer, a dielectric layer, a first transmission line, and a second transmission line. The ground layer is formed of a metal conductor. The dielectric layer is disposed on the ground layer. The first transmission line and the second transmission line are disposed on the dielectric layer. A metal conductor removal block is distributed in at least one portion of at least one of a first projection area of the ground layer on which to project a curved section of the first transmission line and a second projection area of the ground layer on which to project a curved section of the second transmission line. A metal conductor is provided in a region between the first projection area and the second projection area of the ground layer.

In view of the above, in terms of the differential transmission line and the wiring substrate according to the disclosure, removing at least one portion of at least one of the metal conductors of the ground layer to which the curved sections of the first transmission line and the second transmission line correspond may effectively reduce the proportion of common mode noises caused by the differential signal transmitted via the curved sections of the first transmission line and the second transmission line to provide a desired effect of transmitting the differential signal.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF THE EMBODIMENTS

Figure 1A:
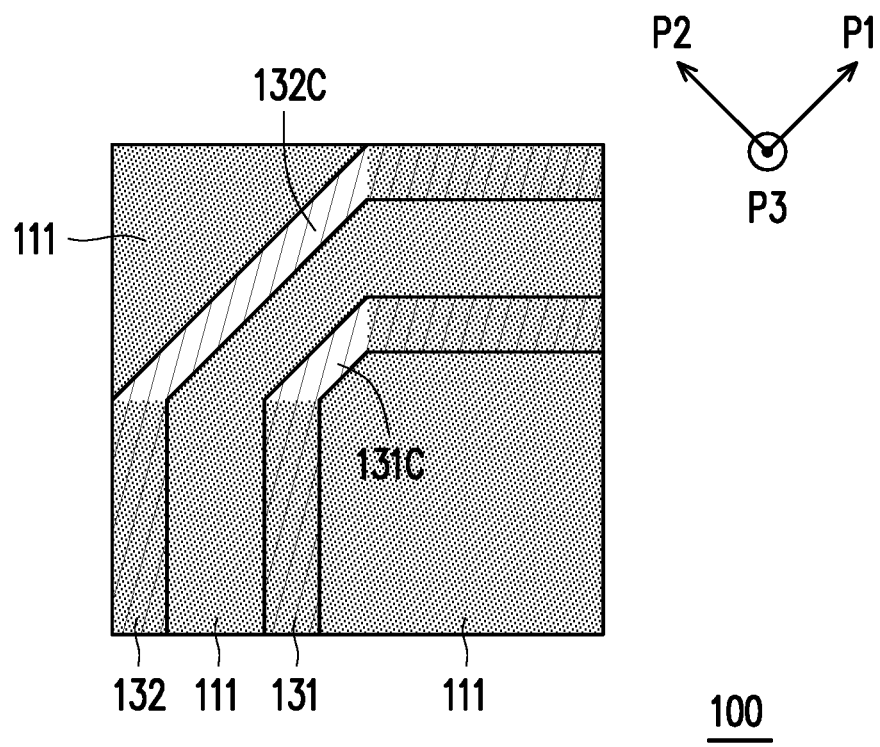
FIG. 1A is a schematic view of a differential transmission line according to a first embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Figure 1B:
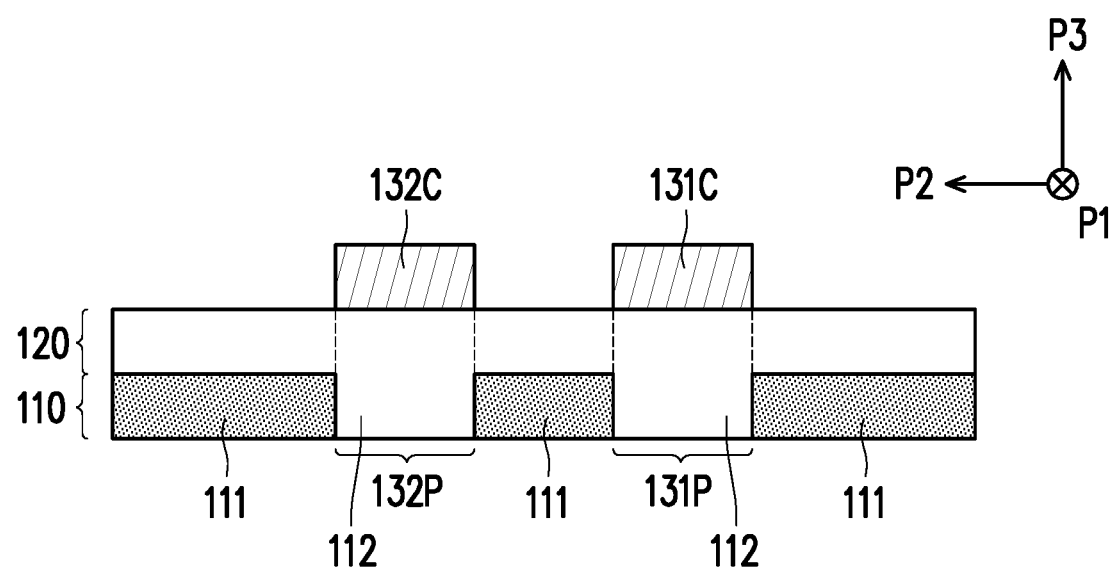
FIG. 1B is a cross-sectional structural view of the differential transmission line according to the embodiment of FIG. 1A.

FIG. 1A is a schematic view (a top perspective view) of a differential transmission line according to a first embodiment of the disclosure. FIG. 1B is a structural view (a cross-sectional structural view) of the differential transmission line according to the embodiment of FIG. 1A. Referring to FIGS. 1A and 1B, a differential transmission line 100 (FIG. 1A) includes a ground layer 110 (FIG. 1B), a dielectric layer 120 (FIG. 1B), a first transmission line 131, and a second transmission line 132 as shown in FIG. 1A. In the embodiment, the differential transmission line 100 may be used in the high-speed transmission of a differential signal, such as being used in the signal transmission of radio frequency (RF). In the embodiment, the ground layer 110 is formed of a metal conductor 111 (a grayscale area) which is made of copper (Cu). The dielectric layer 120 is disposed on the ground layer 110 and is made of, for example, an insulating material. The first transmission line 131 and the second transmission line 132 are disposed on the dielectric layer 120 and are metal wires (hatch area). The first transmission line 131 and the second transmission line 132 are configured to transmit differential signals and match the impedance of the ground layer 110. In addition, in one embodiment, the first transmission line 131 and the second transmission line 132 may also be covered in the dielectric layer 120 entirely.

In the embodiment, a metal conductor removal block 112 (non-grayscale area) is distributed in at least one portion of at least one of a projection area 131P (FIG. 1B) of the ground layer 110 on which to project a curved section of the first transmission line 131 and a projection area 132P (FIG. 1B) of the ground layer 110 on which to project a curved section of the second transmission line 132, and the metal conductor 111 is in a region between the projection area 131P and the projection area 132P of the ground layer 110. In the embodiment, the metal conductor removal block 112 (FIG. 1B) refers to a metal conductor material at a specific position on the plane defined by the ground layer 110 in the first direction P1 and the second direction P2 is completely removed or partially removed in the third direction P3, and the portion of the ground layer 110 at the metal conductor removal block 112 may be completely filled or partially filled with the material of the dielectric layer 120 or other dielectric material, and the disclosure is not limited thereto. Therefore, the impedance matching result of the transmission line and the ground layer 110 will vary correspondingly depending on whether the ground layer 110 has a metal conductor material in the projection area of the transmission line.

In detail, in FIGS. 1A and 1B, the first transmission line 131 and the second transmission line 132 are disposed on a plane formed by a first direction P1 and a second direction P2. The first transmission line 131 and the second transmission line 132 are respectively positioned from the ground layer 110 at the same height in a third direction P3. The first direction P1, the second direction P2, and the third direction P3 are perpendicular to each other. In FIG. 1A, a curved section 131C of the first transmission line 131 and a curved section 132C of the second transmission line 132 refer to transmission line sections extending in the first direction P1, and FIG. 1B is a cross-sectional view illustrating the curved section 131C of the first transmission line 131 and the curved section 132C of the second transmission line 132.

In the embodiment, the metal conductor removal blocks 112 are distributed in the projection area 131P of the ground layer 110 on which to project the curved section 131C of the first transmission line 131 and the projection area 132P of the ground layer 110 on which to project the curved section 132C of the second transmission line 132. In other words, the corresponding metal conductor 111 of the ground layer 110 below the curved section 131C of the first transmission line 131 and the curved section 132C of the second transmission line 132 is removed. Moreover, in the embodiment, the metal conductor 111 remains in a region between the projection area 131P and the projection area 132P of the ground layer below to which the curved section 131C of the first transmission line 131 and the curved section 132C of the second transmission line 132 correspond. In the embodiment, the metal conductor removal block 112 in the projection area 131P extends along a routing direction of the first transmission line 131C, and the metal conductor removal block 112 in the projection area 132P extends along a routing direction of the second transmission line 132C.

In the embodiment, the curved section 131C of the first transmission line 131 and the curved section 132C of the second transmission line 132 have different lengths of transmission routes. Therefore, when the first transmission line 131 and the second transmission line 132 transmit differential signals (pulse signals that are phase inverted from each other) at the same time, the differential signals transmitted via the curved section 131C of the first transmission line 131 and the curved section 132C of the second transmission line 132 may cause common mode noises due to changes in impedance. In this case, in the embodiment, the metal conductor 111 of the ground layer 110 to which the curved section 131C of the first transmission line 131 and the curved section 132C of the second transmission line 132 correspond respectively is removed. Accordingly, the changes in the impedance of the first transmission line 131 and the second transmission line 132 may be adjusted correspondingly to prevent the occurrence of common mode noises.

In other words, no metal conductor 111 is present in the region between the projection area 131P and the projection area 132P of the ground layer 110 to which the curved section 131C of the first transmission line 131 and the curved section 132C of the second transmission line 132 correspond. Accordingly, the moving route of electrons (or current) in the curved section 131C of the first transmission line 131 and the curved section 132C of the second transmission line 132 is to be changed. In other words, the pulse positions of pulse signals transmitted by the first transmission line 131 and the second transmission line 132 respectively may be adjusted correspondingly to maintain a higher phase inversion proportion. Accordingly, the first transmission line 131 and the second transmission line 132 may effectively reduce the proportion of common mode noises caused by the differential signals which are transmitted via the curved section 131C of the first transmission line 131 and the curved section 132C of the second transmission line 132.

In addition, the curved shapes of the curved section 131C of the first transmission line 131 and the curved section 132C of the second transmission line 132 according to an embodiment of the disclosure are not limited to what is illustrated in FIG. 1A. In one embodiment, the curved section 131C of the first transmission line 131 and the curved section 132C of the second transmission line 132 may also be, for example, arc-shaped, right-angle-shaped or in other shapes.

Figure 2A:
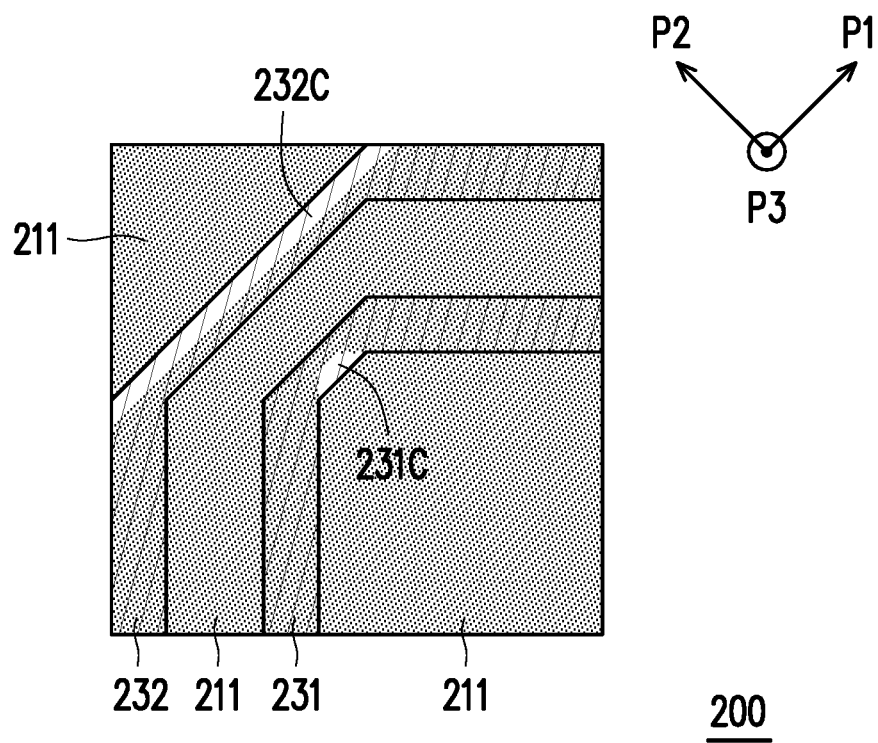
FIG. 2A is a schematic view of a differential transmission line according to a second embodiment of the disclosure.
Figure 2B:
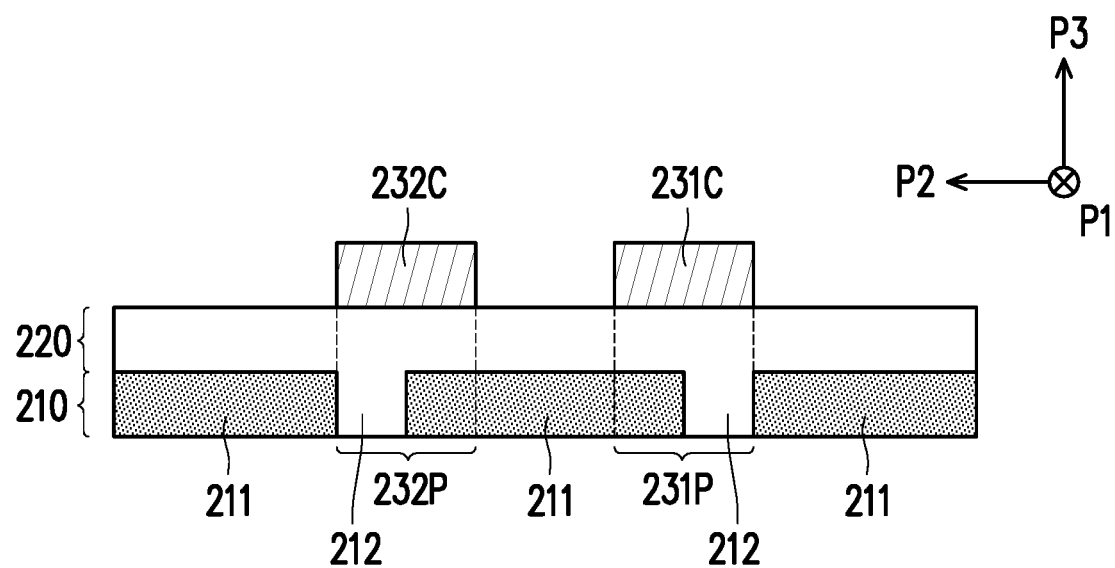
FIG. 2B is a cross-sectional structural view of the differential transmission line according to the embodiment of FIG. 2A.

FIG. 2A is a schematic view (a top perspective view) of a differential transmission line according to a second embodiment of the disclosure. FIG. 2B is a structural view (a cross-sectional structural view) of the differential transmission line according to the embodiment of FIG. 2A. Referring to FIGS. 2A and 2B, a differential transmission line 200 includes a ground layer 210, a dielectric layer 220, a first transmission line 231, and a second transmission line 232. In FIGS. 2A and 2B, a first transmission line 231 and a second transmission line 232 as shown in FIG. 2A are disposed on a plane formed by the first direction P1 and the second direction P2. The first transmission line 231 and the second transmission line 232 are respectively positioned from a ground layer 210 (FIG. 2B) at the same height in the third direction P3. In FIG. 2A, the curved section 231C of the first transmission line 231 and the curved section 232C of the second transmission line 232 refer to transmission line sections extending in the first direction P1, and FIG. 2B is a cross-sectional view illustrating the curved section 231C of the first transmission line 231 and the curved section 232C of the second transmission line 232.

Compared with FIGS. 1A and 1B, in the embodiment, a metal conductor removal block 212 (FIG. 2B) is distributed in at least one portion of each of a projection area 231P (FIG. 2B) of a ground layer 210 on which to project the curved section 231C of the first transmission line 231 and a projection area 232P (FIG. 2B) of the ground layer 210 on which to project the curved section 232C of the second transmission line 232. In other words, at least one portion of a metal conductor 211 of the ground layer 210 below to which the curved section 231C of the first transmission line 231 and the curved section 232C of the second transmission line 232 correspond is removed. Moreover, in the embodiment, the metal conductor 211 remains in a region between the projection area 231P and the projection area 232P of the ground layer 210 below to which the curved section 231C of the first transmission line 231 and the curved section 232C of the second transmission line 232 correspond.

In detail, the metal conductor removal block 212 in the projection area 231P extends along a routing direction of the first transmission line 231C, and the metal conductor removal block 212 in the projection area 232P extends along a routing direction of the second transmission line 232C. Moreover, a portion of the projection area 231P is the metal conductor removal block 212, and the metal conductor removal block 212 in the projection area 231P is formed on a side away from the projection area 232P. A portion of the projection area 232P is the metal conductor removal block 212, and the metal conductor removal block 212 in the projection area 232P is formed on a side away from the projection area 231P.

In the embodiment, the curved section 231C of the first transmission line 231 and the curved section 232C of the second transmission line 232 have different lengths of transmission routes. Accordingly, when the first transmission line 231 and the second transmission line 232 transmit differential signals (pulse signals that are phase inverted from each other) at the same time, the differential signals transmitted via the curved section 231C of the first transmission line 231 and the curved section 232C of the second transmission line 232 may cause common mode noises due to the changes in impedance. In this case, at least one portion of the metal conductor 211 of the ground layer 210 to which the curved section 231C of the first transmission line 231 and the curved section 232C of the second transmission line 232 correspond respectively is removed. Accordingly, the changes in the impedance of the first transmission line 231 and the second transmission line 232 may be adjusted correspondingly to prevent the occurrence of common mode noises.

In other words, no metal conductor 211 is present in some regions of the projection area 231P and the projection area 232P of the ground layer 210 to which the curved section 231C of the first transmission line 231 and the curved section 232C of the second transmission line 232 correspond. Accordingly, the moving route of electrons (or current) in the curved section 231C of the first transmission line 231 and the curved section 232C of the second transmission line 232 is to be changed. In other words, the pulse positions of pulse signals transmitted by the first transmission line 231 and the second transmission line 232 respectively may be adjusted correspondingly to maintain a higher phase inversion proportion. Accordingly, the first transmission line 231 and the second transmission line 232 may reduce the proportion of common mode noises caused by the differential signals transmitted via the curved section 231C of the first transmission line 231 and the curved section 232C of the second transmission line 232.

In addition, the curved shapes of the curved section 231C of the first transmission line 231 and the curved section 232C of the second transmission line 232 according to the disclosure are not limited to what is illustrated in FIG. 2A. In one embodiment, the curved section 231C of the first transmission line 231 and the curved section 232C of the second transmission line 232 may also be, for example, arc-shaped, right-angle-shaped or in other shapes. Additionally, it is possible to design a corresponding, removed area (or width) of the metal conductor removal block 212 in the projection area 231P and the projection area 232P of the ground layer 210 according to the embodiment depending on different transmission line structures. For example, in one embodiment, the removed area (or width) of the metal conductor removal block 212 may be positively correlated to the height between the first transmission line 231, the second transmission line 232, and the ground layer 210.

Figure 3A:
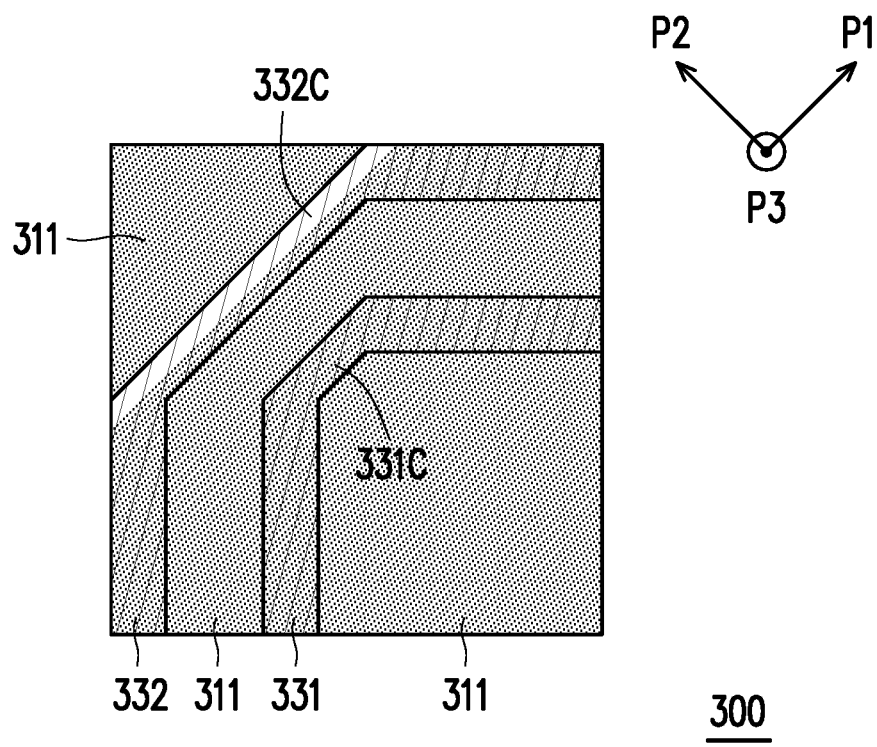
FIG. 3A is a schematic view of a differential transmission line according to a third embodiment of the disclosure.
Figure 3B:
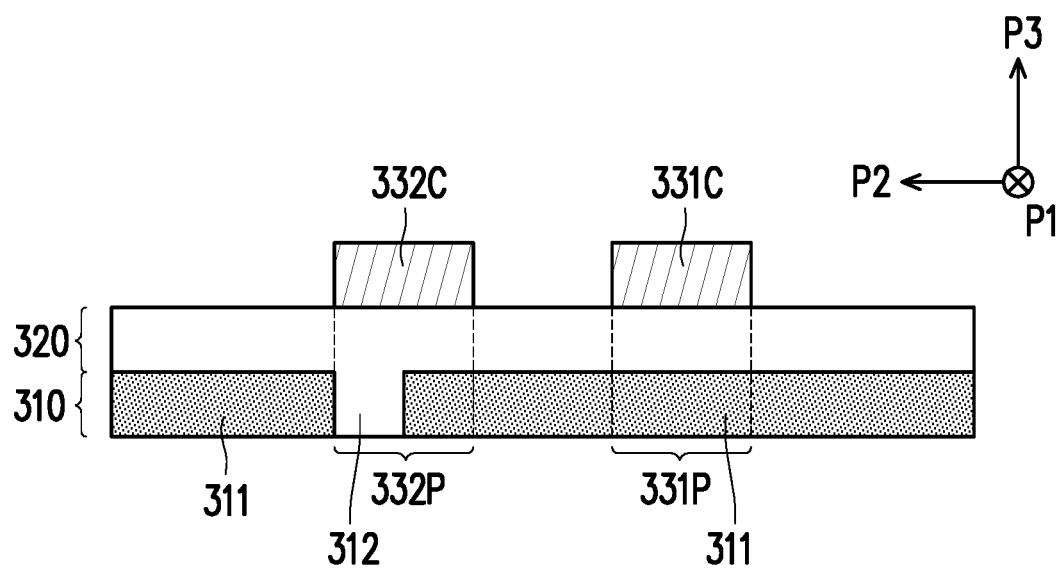
FIG. 3B is a cross-sectional structural view of the differential transmission line according to the embodiment of FIG. 3A.

FIG. 3A is a schematic view (a top perspective view) of a differential transmission line according to a third embodiment of the disclosure. FIG. 3B is a structural view (a cross-sectional structural view) of the differential transmission line according to the embodiment of FIG. 3A. Referring to FIGS. 3A and 3B, a differential transmission line 300 includes a ground layer 310, a dielectric layer 320, a first transmission line 331, and a second transmission line 332. In FIGS. 3A and 3B, a first transmission line 331 and a second transmission line 332 as shown in FIG. 3A are disposed on a plane formed by the first direction P1 and the second direction P2. The first transmission line 331 and the second transmission line 332 are respectively positioned from a ground layer 310 (FIG. 3B) at the same height in the third direction P3. In FIG. 3A, a curved section 331C of the first transmission line 331 and a curved section 332C of the second transmission line 332 refer to transmission line sections extending in the first direction P1, and FIG. 3B is a cross-sectional view of the curved section 331C of the first transmission line 331 and the curved section 332C of the second transmission line 332.

Compared with FIGS. 2A and 2B, in the embodiment, a metal conductor 311 is present in a projection area 331P (FIG. 3B) of the ground layer 310 on which to project the curved section 331C of the first transmission line 331, and a metal conductor removal block 312 (FIG. 3B) is distributed in at least one portion of a projection area 332P (FIG. 3B) of the ground layer 310 on which to project the curved section 332C of the second transmission line 332. In other words, at least one portion of the metal conductor 311 of the ground layer 310 below to which the curved section 332C of the second transmission line 332 corresponds is removed. In the embodiment, the metal conductor 311 remains in a region between the projection area 331P and the projection area 332P of the ground layer 310 below to which the curved section 331C of the first transmission line 331 and the curved section 332C of the second transmission line 332 correspond.

In detail, the metal conductor removal block 312 in the projection area 332P extends along a routing direction of the second transmission line 332. Moreover, a portion of the projection area 332P is the metal conductor removal block 312, and the metal conductor removal block 312 in the projection area 332P is formed on a side away from the projection area 331P. However, the removed position of the metal conductor 311 of the ground layer 310 is not limited to the above situation. In one embodiment, at least one portion of the projection area 331P of the ground layer 310 on which to project the curved section 331C of the first transmission line 331 may also be the metal conductor removal block 312, and the metal conductor 311 is present in the projection area 332P of the ground layer 310 on which to project the curved section 332C of the second transmission line 332.

In the embodiment, the curved section 331C of the first transmission line 331 and the curved section 332 of the second transmission line 332 have different lengths of transmission routes. Accordingly, when the first transmission line 331 and the second transmission line 332 transmit differential signals (pulse signals that are phase inverted from each other) at the same time, the differential signals transmitted via the curved section 331C of the first transmission line 331 and the curved section 332C of the second transmission line 332 cause common mode noises due to the changes in impedance. In this case, at least one portion of the metal conductor 311 of the ground layer 310 to which the curved section 332C of the second transmission line 332 corresponds is removed. Accordingly, the changes in the impedance of the second transmission line 332 may be adjusted correspondingly to prevent the occurrence of common mode noises.

In other words, no metal conductor 311 is present in some regions of the projection area 332P of the ground layer 310 to which the curved section 332C of the second transmission line 332 corresponds. Accordingly, the moving route of electrons (or current) in the curved section 332C of the second transmission line 332 is to be changed. In other words, the pulse positions of pulse signals transmitted by the second transmission line 332 may be adjusted correspondingly to maintain a higher phase inversion proportion compared with pulse signals transmitted by the first transmission line 331. Accordingly, the first transmission line 331 and the second transmission line 332 may effectively reduce the proportion of common mode noises caused by the differential signals transmitted via the curved section 331C of the first transmission line 331 and the curved section 332C of the second transmission line 332.

In addition, the curved shapes of the curved section 331C of the first transmission line 331 and the curved section 332C of the second transmission line 332C are not limited to what is illustrated in FIG. 3A. In one embodiment, the curved section 331C of the first transmission line 331 and the curved section 332C of the second transmission line 332 may also be, for example, arc-shaped, right-angle-shaped or in other shapes. In addition, it is possible to design a corresponding, removed area (or width) of the metal conductor removal block 312 in the projection area 332P of the ground layer 310 according to the embodiment depending on different transmission line structures. For example, in one embodiment, the removed area (or width) of the metal conductor removal block 312 is positively correlated to the height between the second transmission line 332 and the ground layer 310.

Figure 4A:
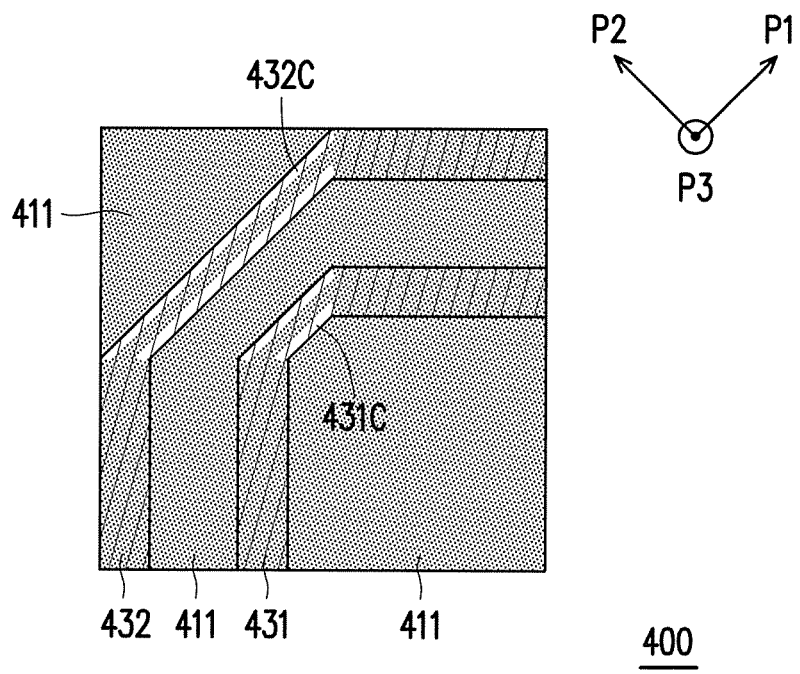
FIG. 4A is a schematic view of a differential transmission line according to a fourth embodiment of the disclosure.
Figure 4B:
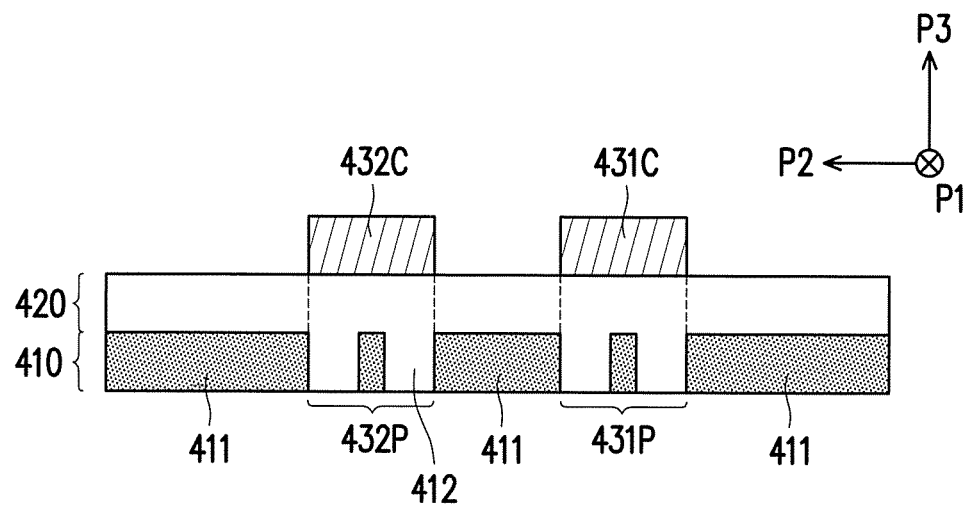
FIG. 4B is a cross-sectional structural view of the differential transmission line according to the embodiment of FIG. 4A.

FIG. 4A is a schematic view (a top perspective view) of a differential transmission line according to a fourth embodiment of the disclosure. FIG. 4B is a structural view (a cross-sectional structural view) of the differential transmission line according to the embodiment of FIG. 4A. Referring to FIGS. 4A and 4B, a differential transmission line 400 includes a ground layer 410, a dielectric layer 420, a first transmission line 431, and a second transmission line 432. In FIGS. 4A and 4B, a first transmission line 431 and a second transmission line 432 as shown in FIG. 4A are disposed on a plane formed by the first direction P1 and the second direction P2. The first transmission line 431 and the second transmission line 432 are respectively positioned from a ground layer 410 (FIG. 4B) at the same height in the third direction P3. In FIG. 4A, a curved section 431C of the first transmission line 431 and a curved section 432C of the second transmission line 432 refer to transmission line sections extending in the first direction P1, and FIG. 4B is a cross-sectional view of the curved section 431C of the first transmission line 431 and the curved section 432C of the second transmission line 432.

Compared with FIGS. 1A and 1B, in the embodiment, a projection area 431P (FIG. 4B) of the ground layer 410 on which to project the curved section 431C of the first transmission line 431 includes a plurality of metal conductor removal blocks disposed parallel to a routing direction of the first transmission line 431, and a projection area 432P (FIG. 4B) of the ground layer 410 on which to project the curved section 432C of the second transmission line 432 includes a plurality of metal conductor removal blocks disposed parallel to a routing direction of the second transmission line 432.

In detail, portions of a metal conductor 411 of the ground layer 410 below to which the curved section 431C of the first transmission line 431 corresponds are removed. The portions are parallel to a routing direction of the curved section 431C of the first transmission line 431, and the metal conductor 411 remains between the portions. Likewise, the portions of the metal conductor 411 of the ground layer 410 below to which the curved section 432C of the second transmission line 432 corresponds are also removed. The portions are parallel to the routing direction of the curved section 432C of the second transmission line 432, and the metal conductor 411 remains between the portions. Moreover, in the embodiment, the metal conductor 411 remains in a region between the projection areas of the first transmission line 431 and the second transmission line 432 in the ground layer 410 below to which the curved section 431C of the first transmission line 431 and the curved section 432C of the second transmission line 432 correspond.

In the embodiment, the curved section 431C of the first transmission line 431 and the curved section 432C of the second transmission line 432 have different lengths of transmission routes. Accordingly, when the first transmission line 431 and the second transmission line 432 transmit differential signals (pulse signals that are phase inverted from each other) at the same time, the differential signals transmitted via the curved section 431C of the first transmission line 431 and the curved section 432C of the second transmission line 432 cause common mode noises due to the changes in impedance. In this case, a plurality of portions of the metal conductor 411 of the ground layer 410 to which the curved section 431C of the first transmission line 431 and the curved section 432C of the second transmission line 432 correspond respectively are removed. Accordingly, the changes in the impedances of the first transmission line 431 and the second transmission line 432 may be adjusted correspondingly to reduce the proportion of common mode noises.

In other words, no metal conductor 411 is present in some regions between the projection area 431P and the projection area 432P of the ground layer 410 to which the curved section 431C of the first transmission line 431 and the curved section 432C of the second transmission line 432 correspond. Accordingly, the moving route of electrons (or current) in the curved section 431C of the first transmission line 431 and the curved section 432C of the second transmission line 432 is to be changed. In other words, the pulse positions of pulse signals transmitted by the first transmission line 431 and the second transmission line 432 respectively may be adjusted correspondingly to maintain a higher phase inversion proportion. Accordingly, the first transmission line 431 and the second transmission line 432 may effectively reduce the proportion of common mode noises caused by the differential signals transmitted via the curved section 431C of the first transmission line 431 and the curved section 432C of the second transmission line 432.

In addition, the curved shapes of the curved section 431C of the first transmission line 431 and the curved section 432C of the second transmission line 432 according to the disclosure are not limited to what is illustrated in FIG. 4A. In one embodiment, the curved section 431C of the first transmission line 431 and the curved section 432C of the second transmission line 432 may also be, for example, arc-shaped, right-angle-shaped or in other shapes. In addition, it is possible to design corresponding, removed areas (or widths) of a plurality of metal conductor removal blocks 412 (FIG. 4B) and the distance between the metal conductor removal blocks 412 that are in the projection areas in the ground layer 410 according to the embodiment of the curved section 431C of the first transmission line 431 and the curved section 432C of the second transmission line 432 depending on different transmission line structures. For example, in one embodiment, the removed area (or width) of the metal conductor removal block 412 may be positively correlated to the height between the first transmission line 431, the second transmission line 432, and the ground layer 410.

Figure 5A:
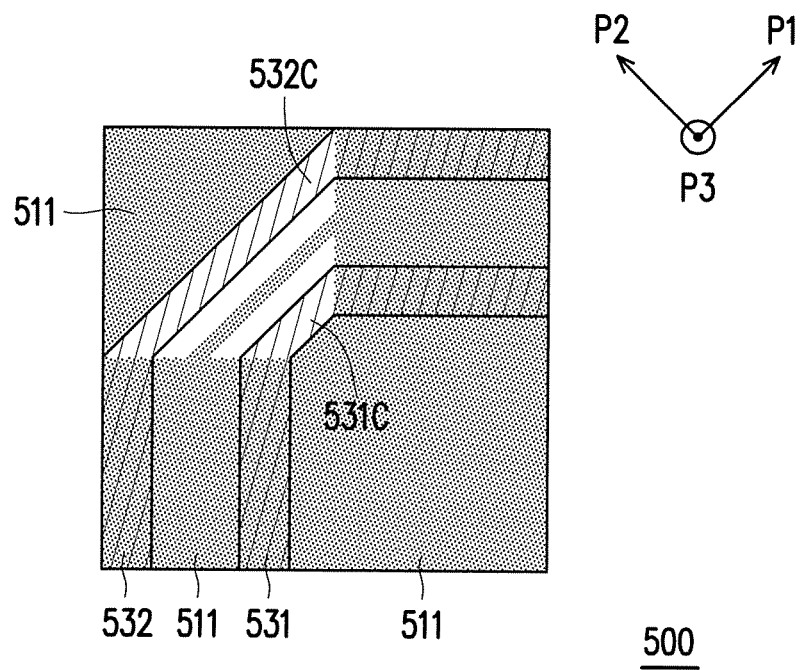
FIG. 5A is a schematic view of a differential transmission line according to a fifth embodiment of the disclosure.
Figure 5B:
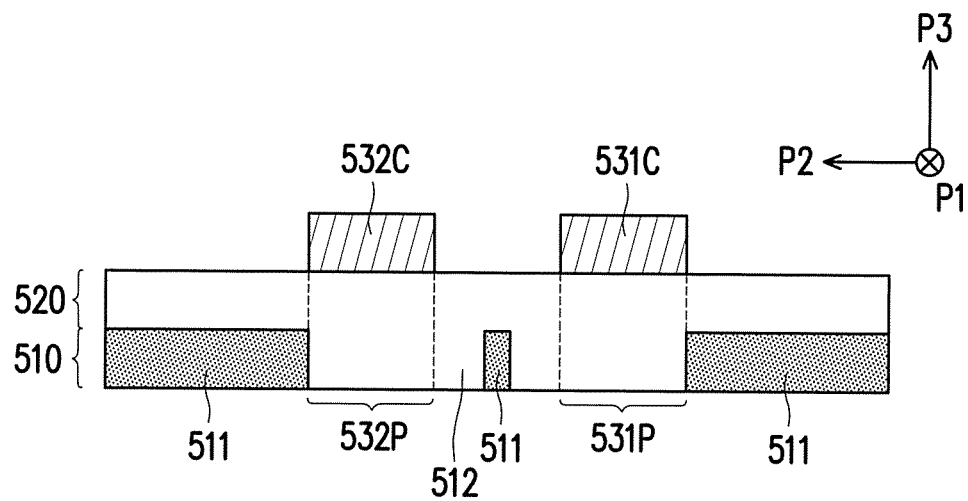
FIG. 5B is a cross-sectional structural view of the differential transmission line according to the embodiment of FIG. 5A.

FIG. 5A is a schematic view (a top perspective view) of a differential transmission line according to a fifth embodiment of the disclosure. FIG. 5B is a structural view (a cross-sectional structural view) of the differential transmission line according to the embodiment of FIG. 5A. Referring to FIGS. 5A and 5B, a differential transmission line 500 includes a ground layer 510, a dielectric layer 520, a first transmission line 531, and a second transmission line 532. In FIGS. 5A and 5B, a first transmission line 531 and a second transmission line 532 as shown in FIG. 5A are disposed on a plane formed by the first direction P1 and the second direction P2. The first transmission line 531 and the second transmission line 532 are respectively positioned from a ground layer 510 (FIG. 5B) at the same height in the third direction P3.

In FIG. 5A, a curved section 531C of the first transmission line 531 and the curved section 532C of the second transmission line 532 refer to transmission line sections extending in the first direction P1, and FIG. 5B is a cross-sectional view of the curved section 531C of the first transmission line 531 and the curved section 532C of the second transmission line 532.

Compared with FIGS. 1A and 1B, a projection area 531P (FIG. 5B) of the ground layer 510 on which to project the curved section 531C of the first transmission line 531 and a projection area 532P (FIG. 5B) of the ground layer 510 on which to project the curved section 532C of the second transmission line 532 are metal conductor removal blocks 512 (FIG. 5B). The outer portions of a region between the projection areas 531P and 532P are metal conductor removal blocks 512, and a metal conductor 511 remains in the middle of the region between the projection areas 531P and 532P.

In detail, the metal conductor 511 of the ground layer 510 below to which the curved section 531C of the first transmission line 531 and the curved section 532C of the second transmission line 532 correspond is removed completely. The outer portions in a region between the projection areas 531P and 532P of the ground layer 510 are also removed, and the outer portions are parallel to the routing directions of the first transmission line 531 and the second transmission line 532. In other words, only the metal conductor 511 remains in the middle of the region between the projection areas 531P and 532P of the ground layer 510, and the metal conductor 511 is formed parallel to the routing directions of the first transmission line 531 and the second transmission line 532.

In the embodiment, the curved section 531C of the first transmission line 531 and the curved section 532C of the second transmission line 532 have different lengths of transmission routes. Accordingly, when the first transmission line 531 and the second transmission line 532 transmit differential signals (pulse signals that are phase inverted from each other) at the same time, the differential signals transmitted via the curved section 531C of the first transmission line 531 and the curved section 532C of the second transmission line 532 cause common mode noises due to the changes in impedance. In this case, the metal conductor 511 of the ground layer 510 to which the curved section 531C of the first transmission line 531 and the curved section 532C of the second transmission line 532 correspond respectively is removed, and the metal conductor 511 in the outer portions of a region of the ground layer 510 between the curved sections 531C and 532C is also removed. Accordingly, the changes in the impedance of the first transmission line 531 and the second transmission line 532 may be adjusted correspondingly to reduce the occurrence of common mode noises.

In other words, the metal conductor 511 is present neither in the projection areas 531P and 532P of the ground layer 510 to which the curved section 531C of the first transmission line 531 and the curved section 532C of the second transmission line 532 correspond and nor in the outer portions of the region between the projection areas 531P and 532P of the ground layer 510. Accordingly, the moving route of electrons (or current) in the curved section 531C of the first transmission line 531 and the curved section 532C of the second transmission line 532 is to be changed. In other words, pulse signals transmitted by the first transmission line 531 and the second transmission line 532 respectively may also be adjusted correspondingly to maintain a higher phase inversion proportion. Accordingly, the first transmission line 531 and the second transmission line 532 may effectively reduce the proportion of common mode noises caused by the differential signals transmitted via the curved section 531C of the first transmission line 531 and the curved section 532C of the second transmission line 532.

Figure 6:
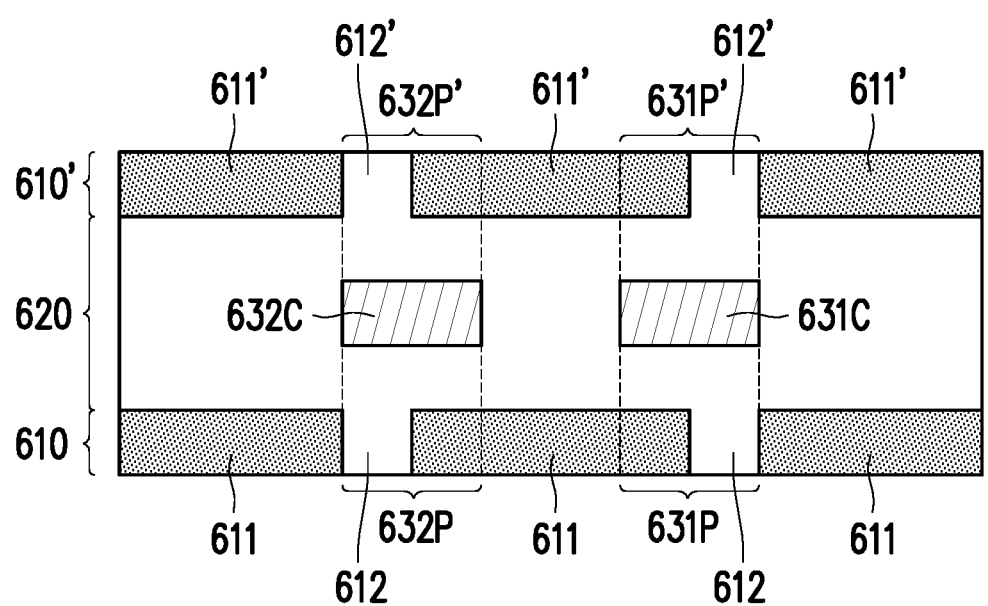
FIG. 6 is a cross-sectional structural view of a differential transmission line according to an embodiment of the disclosure.

FIG. 6 is a structural view (a cross-sectional structural view) of a differential transmission line according to an embodiment of the disclosure. Referring to FIG. 6, a differential transmission line structure of a double-layer ground layer is provided and applicable to the first to fifth embodiments of the disclosure correspondingly. In the embodiment, the differential transmission line structure includes ground layers 610 and 610', a dielectric layer 620, a curved section 631C of a first transmission line, and a curved section 632C of a second transmission line. It should be noted that the differential transmission line structure according to the embodiment may correspond to, for example, the differential transmission line of FIG. 2A. However, compared with FIG. 2B, the differential transmission line structure according to the embodiment includes the ground layers 610 and 610'. In the embodiment, a metal conductor removal block 612 is distributed in at least one portion of each of a projection area 631P of the ground layer 610 on which to project the curved section 631C of the first transmission line and a projection area 632P of the ground layer 610 on which to project the curved section 632C of the second transmission line. Moreover, in the embodiment, at least one portion of each of a projection area 631P' of the ground layer 610' on which to project the curved section 631C of the first transmission line and a projection area 632P' of the ground layer 610' on which to project the curved section 632C of the second transmission line is also a metal conductor removal block 612'.

In the embodiment, the metal conductor removal block 612 in the projection area 631P and the metal conductor removal block 612' in the projection area 631P', for example, may extend along a routing direction of the first transmission line, and the metal conductor removal block 612 in the projection area 632P and the metal conductor removal block 612' in the projection area 632P', for example, may extend along a routing direction of the second transmission line.

Moreover, the metal conductor removal block 612 in the projection area 631P and the metal conductor removal block 612' in the projection area 631P' are formed on a side away from the projection areas 632P and 632P'. The metal conductor removal block 612 in the projection area 632P and the metal conductor removal block 612' in the projection area 632P' are formed on a side away from the projection areas 631P and 631P'. However, the method of removing the metal conductor of the ground layers 610 and 610' according to the embodiment is not limited to the above embodiment. In one embodiment, the method of removing the metal conductor of the ground layers 610 and 610', for example, may be the method described in one of the first to fifth embodiments of the disclosure.

In this case, in the embodiment, at least one portion of a metal conductor 611 of the ground layer 610 to which the curved section 631C of the first transmission line and the curved section 632C of the second transmission line correspond is removed. At least one portion of a metal conductor 611' of the ground layer 610' to which the curved section 631C of the first transmission line and the curved section 632C of the second transmission line correspond is removed. Accordingly, the changes in the impedance of the first transmission line and the second transmission line according to the embodiment may be adjusted correspondingly to reduce the occurrence of common mode noises. In addition, descriptions in the first to fifth embodiments may provide sufficient teachings and suggestions regarding other structural features, the specifics of implementation or technical effects of the first transmission line and the second transmission line according to the embodiment. Accordingly, redundant descriptions are omitted.

Figure 7:
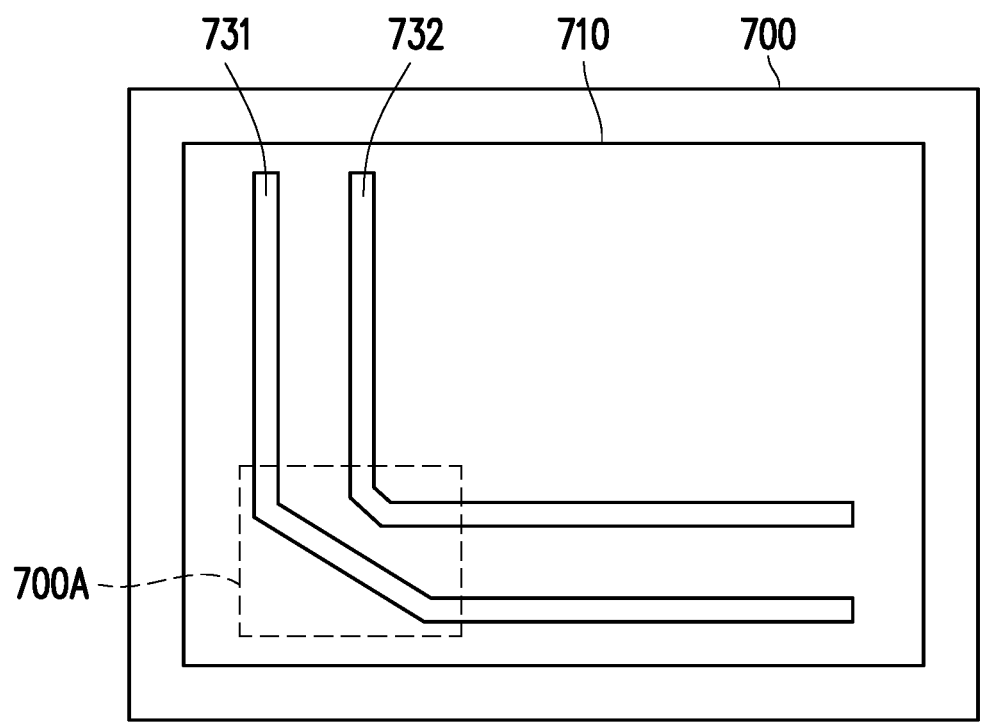
FIG. 7 is a schematic view of a wiring substrate according to an embodiment of the disclosure.
Figure 8A:
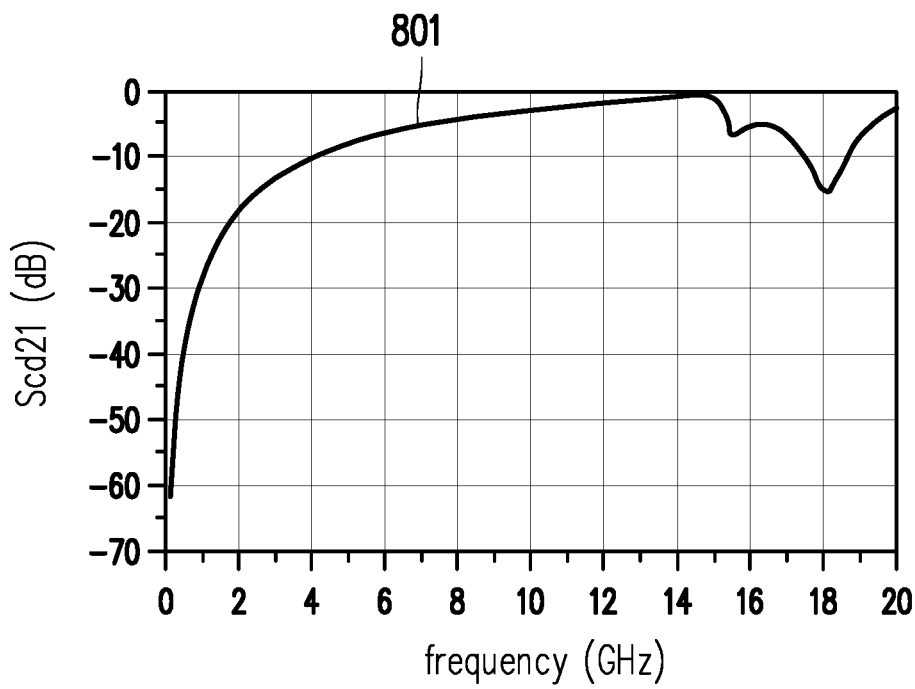
FIGS. 8A and 8B are S-parameter plots of common mode noises of the differential transmission line according to the embodiment of FIG. 7.
Figure 8B:
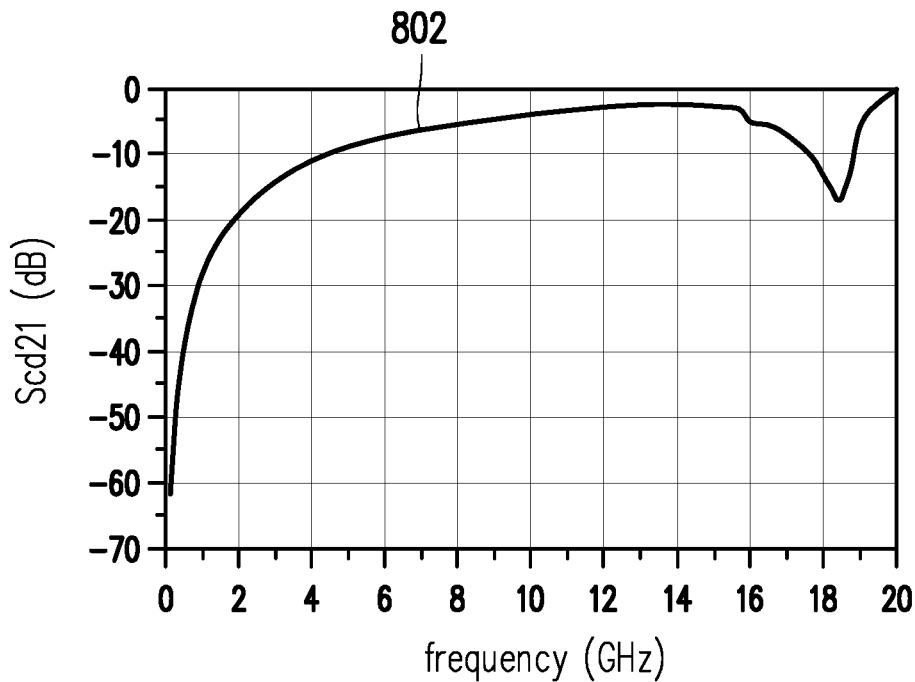

FIG. 7 is a schematic view of a wiring substrate according to an embodiment of the disclosure. FIGS. 8A and 8B are S-parameter plots of common mode noises of the differential transmission line according to the embodiment of FIG. 7. Referring to FIGS. 7, 8A and 8B, a wiring substrate 700 (FIG. 7) includes a differential transmission line structure. In the embodiment, the differential transmission line structure includes a first transmission line 731 and a second transmission line 732 which are disposed on a ground layer 710 as shown in FIG. 7. The first transmission line 731 and the second transmission line 732 are spaced apart by a dielectric layer from the ground layer 710, respectively. The first transmission line 731 and the second transmission line 732 are configured to form differential transmission lines and to transmit differential signals (pulse signals that are phase inverted from each other). In the embodiment, the first transmission line 731 and the second transmission line 732 have a curved section 700A (FIG. 7), and one of the ways of removing the metal conductor of the ground layer according to the respective embodiments, for example, is applicable to the curved section 700A to reduce the common mode noises caused by the differential signals transmitted via the curved sections 700A.

For example, as what is shown in FIG. 8A, an S parametric curve 801 is configured to indicate that metal conductors of the grounder layer 710 to which the curved sections 700A correspond respectively are not removed. As shown in FIG. 8B, an S parametric curve 802 is configured to indicate a result that the methods of removing the metal conductor of the ground layer according to the embodiments of FIGS. 2A and 2B are performed on the curved sections 700A. Compared with the S parametric curves 801 and 802, when the first transmission line 731 and the second transmission line 732 transmit radio frequency differential signals which, for example, have a transmission frequency (GHz) of 2.38 GHz, damage to the differential transmission line caused by common mode noises of 4.868 GHz is reduced to −19.739 dB from −19.529 dB if the methods of removing the metal conductor of the ground layer according to the embodiments of FIGS. 2A and 2B are performed on the curved sections 700A. Accordingly, the differential transmission line of the wiring substrate according to the embodiment may effectively reduce the proportion (Scd21 (dB)) of common mode noises caused by the changes in the impedance of the curved section of the differential transmission line.

Figure 9:
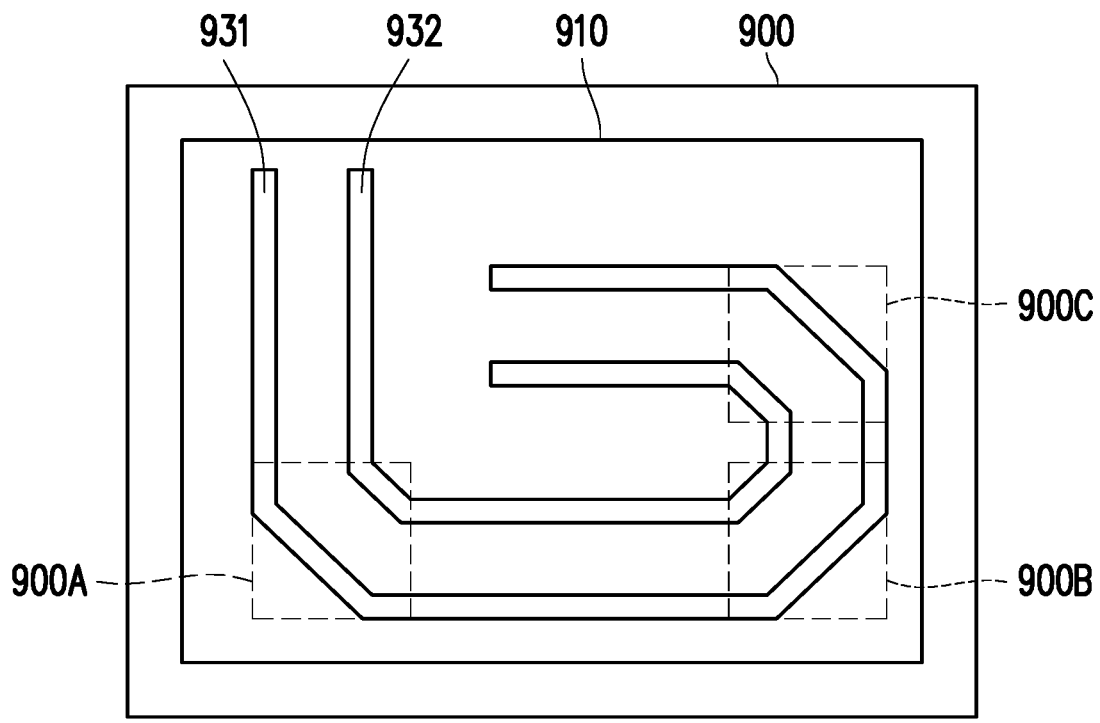
FIG. 9 is a schematic view of a wiring substrate according to another embodiment of the disclosure.
Figure 10:
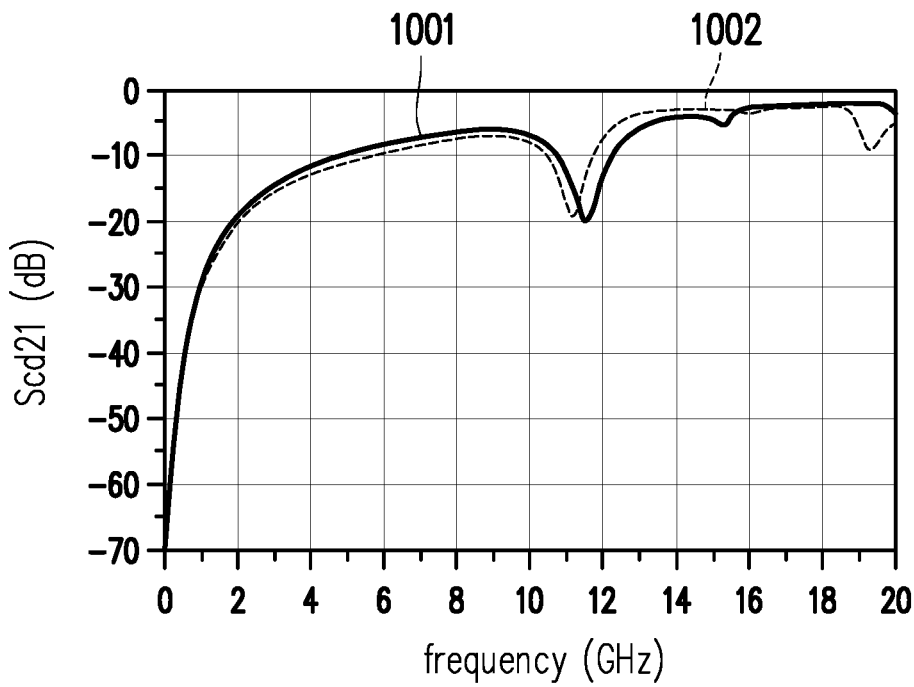
FIG. 10 is an S-parameter plot of common mode noises of the differential transmission line according to the embodiment of FIG. 9.

FIG. 9 is a schematic view of a wiring substrate according to another embodiment of the disclosure. FIG. 10 is an S-parametric plot of common mode noises of the differential transmission line according to the embodiment of FIG. 9. Referring to FIGS. 9 and 10, a wiring substrate 900 (FIG. 9) includes at least one differential transmission line structure. In the embodiment, the differential transmission line structure includes a first transmission line 931 and a second transmission line 932 which are disposed on a ground layer 910 as shown in FIG. 9. The first transmission line 931 and the second transmission line 932 are spaced apart by a dielectric layer from the ground layer 910, respectively. The first transmission line 931 and the second transmission line 932 are configured to form differential transmission lines and to transmit differential signals (pulse signals that are phase inverted from each other). In the embodiment, the first transmission line 931 and the second transmission line 932 have a plurality of curved sections 900A, 900B, and 900C as shown in FIG. 9, and one of the methods of removing the metal conductor according to the respective embodiments, for example, is applicable to the curved sections 900A, 900B, and 900C to reduce the common mode noises caused by the differential signals transmitted via the curved sections 900A, 900B, and 900C.

For example, as what is shown in FIG. 10, an S parametric curve 1001 is configured to indicate that metal conductors of the ground layer 910 to which the curved sections 900A, 900B, and 900C correspond are not removed. An S parametric curve 1002 is configured to indicate a result that the methods of removing the metal conductor of the ground layer according to the embodiments of FIGS. 2A and 2B are performed on the curved sections 900A, 900B, and 900C. Compared with the S parametric curves 1001 and 1002, when the first transmission line 931 and the second transmission line 932 transmit radio frequency differential signals, which for example, have a transmission frequency of 2.38 GHz, damage to the differential transmission line caused by common mode noises having a frequency of 2.38 GHz may be reduced to −18.068 dB from −17.133 dB if the methods of removing the metal conductor of the ground layer according to the embodiments of FIGS. 2A and 2B are performed on the curved sections 900A, 900B, and 900C. Accordingly, the differential transmission line of the wiring substrate according to the embodiment may effectively reduce the proportion (Scd21 (dB)) of common mode noises caused by the changes in the impedance of the curved section of the differential transmission line.

In view of the foregoing, in terms of the differential transmission line and the wiring substrate of the disclosure, the metal conductor in the region of the ground layer to which the curved section of the differential transmission line corresponds is removed to adjust impedance with equal effects of the curved section of the differential transmission line correspondingly. Accordingly, the differential transmission line and the wiring substrate according to the disclosure may effectively reduce the common mode noises caused by the changes in the impedance of the curved section of the differential transmission line, thereby effectively reducing the proportion (Scd21) of common mode noises in the differential signal.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A differential transmission line, comprising:
a ground layer, formed of a metal conductor;
a dielectric layer, disposed on the ground layer; and
a first transmission line for transmitting a first signal and a second transmission line for transmitting a second signal, disposed on the dielectric layer,
wherein the first and second signals are phase inverted from each other,
wherein a metal conductor removal block is distributed in at least one portion of at least one of a first projection area of the ground layer on which to project a curved section of the first transmission line and a second projection area of the ground layer on which to project a curved section of the second transmission line, and the metal conductor is provided in an entire region between the first projection area and the second projection area of the ground layer.

2. The differential transmission line according to claim 1, wherein the metal conductor removal block is distributed in at least one portion of one of the first projection area and the second projection area, and the metal conductor is provided in an entire region of the other of the first projection area and the second projection area.

3. The differential transmission line according to claim 1, wherein the metal conductor removal block is further distributed in at least one portion of each of the first projection area and the second projection area.

4. The differential transmission line according to claim 1, wherein the metal conductor removal block in the first projection area extends along a routing direction of the first transmission line.

5. The differential transmission line according to claim 1, wherein the metal conductor removal block in the second projection area extends along a routing direction of the second transmission line.

6. The differential transmission line according to claim 1, wherein the metal conductor removal block is distributed in a portion of the first projection area, formed in the first projection area of the ground layer on which to project the curved section of the first transmission line, and disposed parallel to a routing direction of the first transmission line.

7. The differential transmission line according to claim 1, wherein the metal conductor removal block is distributed in a portion of the second projection area, formed in the second projection area of the ground layer on which to project the curved section of the second transmission line, and disposed parallel to a routing direction of the second transmission line.

8. The differential transmission line according to claim 1, further comprises a plurality of sub metal conductor removal blocks of the metal conductor removal block distributed in the first projection area and disposed parallel to a routing direction of the first transmission line.

9. The differential transmission line according to claim 1, further comprises a plurality of sub metal conductor removal blocks of the metal conductor removal block distributed in the second projection area and disposed parallel to a routing direction of the second transmission line.

10. The differential transmission line according to claim 1, the differential transmission line comprising:
another ground layer, disposed on the dielectric layer and formed of another metal conductor, wherein the first transmission line and the second transmission line are disposed within the dielectric layer,
wherein another metal conductor removal block is distributed in at least one portion of at least one of another first projection area of the another ground layer on which to project the curved section of the first transmission line and another second projection area of the another ground layer on which to project the curved section of the second transmission line, and the another metal conductor is provided in a region between the another first projection area and the another second projection area of the another ground layer.

11. A wiring substrate, comprising:
at least one differential transmission line structure, wherein the at least one differential transmission line structure includes:
a ground layer, formed of a metal conductor;
a dielectric layer, disposed on the ground layer; and
a first transmission line for transmitting a first signal and a second transmission line for transmitting a second signal, disposed on the dielectric layer,
wherein the first and second signals are phase inverted from each other,
wherein a metal conductor removal block is distributed in at least one portion of at least one of a first projection area of the ground layer on which to project a curved section of the first transmission line and a second projection area of the ground layer on which to project a curved section of the second transmission line, and the metal conductor is provided in an entire region between the first projection area and the second projection area of the ground layer.

12. The wiring substrate according to claim 11, wherein the metal conductor removal block is distributed in at least one portion of one of the first projection area and the second projection area, and the metal conductor is provided in an entire region of the other of the first projection area and the second projection area.

13. The wiring substrate according to claim 11, wherein the metal conductor removal block is further distributed in at least one portion of each of the first projection area and the second projection area.

14. The wiring substrate according to claim 11, wherein the metal conductor removal block in the first projection area extends along a routing direction of the first transmission line.

15. The wiring substrate according to claim 11, wherein the metal conductor removal block in the second projection area extends along a routing direction of the second transmission line.

16. The wiring substrate according to claim 11, wherein the metal conductor removal block is distributed in a portion of the first projection area, formed in the first projection area of the ground layer on which to project the curved section of the first transmission line, and disposed parallel to a routing direction of the first transmission line.

17. The wiring substrate according to claim 11, wherein the metal conductor removal block is distributed in a portion of the second projection area, formed in the second projection area of the ground layer on which to project the curved section of the second transmission line, and disposed parallel to a routing direction of the second transmission line.

18. The wiring substrate according to claim 11, further comprises a plurality of sub metal conductor removal blocks of the metal conductor removal block distributed in the first projection area and disposed parallel to a routing direction of the first transmission line.

19. The wiring substrate according to claim 11, further comprises a plurality of sub metal conductor removal blocks of the metal conductor removal block distributed in the second projection area and disposed parallel to a routing direction of the second transmission line.

20. The wiring substrate according to claim 11, wherein the at least one differential transmission line structure further comprises:
another ground layer, disposed on the dielectric layer and formed of another metal conductor, wherein the first transmission line and the second transmission line are disposed within the dielectric layer,
wherein another metal conductor removal block is distributed in at least one portion of at least one of another first projection area of the another ground layer on which to project the curved section of the first transmission line and another second projection area of the another ground layer on which to project the curved section of the second transmission line, and the another metal conductor is provided in a region between the another first projection area and the another second projection area of the another ground layer.

21. A differential transmission line, comprising:
a ground layer, formed of a metal conductor;
a dielectric layer, disposed on the ground layer; and
a first transmission line and a second transmission line, disposed on the dielectric layer,
wherein a metal conductor removal block is distributed in at least one portion of one of a first projection area of the ground layer on which to project a curved section of the first transmission line and a second projection area of the ground layer on which to project a curved section of the second transmission line, and the metal conductor is provided in an entire region of the other of the first projection area and the second projection area.

22. A wiring substrate, comprising:
at least one differential transmission line structure, wherein the at least one differential transmission line structure includes:
a ground layer, formed of a metal conductor;
a dielectric layer, disposed on the ground layer; and
a first transmission line and a second transmission line, disposed on the dielectric layer,
wherein a metal conductor removal block is distributed in at least one portion of one of a first projection area of the ground layer on which to project a curved section of the first transmission line and a second projection area of the ground layer on which to project a curved section of the second transmission line, and the metal conductor is provided in an entire region of the other of the first projection area and the second projection area.

* * * * *